US010756765B2

(12) United States Patent
Nakamura et al.

(10) Patent No.: US 10,756,765 B2
(45) Date of Patent: Aug. 25, 2020

(54) OPTICAL RECEPTION APPARATUS, SYSTEM, AND CONTROL METHOD

(71) Applicant: NEC Corporation, Tokyo (JP)

(72) Inventors: Tatsuya Nakamura, Tokyo (JP); Junichi Abe, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 16/084,807

(22) PCT Filed: Apr. 14, 2017

(86) PCT No.: PCT/JP2017/015286
§ 371 (c)(1),
(2) Date: Sep. 13, 2018

(87) PCT Pub. No.: WO2017/188026
PCT Pub. Date: Nov. 2, 2017

(65) Prior Publication Data
US 2019/0081645 A1 Mar. 14, 2019

(30) Foreign Application Priority Data
Apr. 26, 2016 (JP) ................. 2016-088172

(51) Int. Cl.
H03M 13/00 (2006.01)
H03M 13/45 (2006.01)
(Continued)

(52) U.S. Cl.
CPC ......... *H03M 13/45* (2013.01); *H03M 13/612* (2013.01); *H04B 10/61* (2013.01);
(Continued)

(58) Field of Classification Search
CPC ............... H03M 13/45; H03M 13/612; H03M 13/2957; H03M 13/1111; H04B 10/616;
(Continued)

(56) References Cited

U.S. PATENT DOCUMENTS 9,203,558 B1* 12/2015 Dave ............... H04L 1/0054
2002/0159535 A1 10/2002 Agami et al.
2016/0344580 A1* 11/2016 Konishi ........... H04L 27/3444

FOREIGN PATENT DOCUMENTS

JP 2002-330188 A 11/2002
JP 2008-519519 A 6/2008
(Continued)

OTHER PUBLICATIONS

International Search Report dated Jun. 20, 2017, in counterpart PCT International Application No. PCT/JP2017/015286.

*Primary Examiner* — Samir W Rizk
(74) *Attorney, Agent, or Firm* — Finnegan, Henderson, Farabow, Garrett & Dunner, L.L.P.

(57) ABSTRACT

An optical transmission apparatus (100) generates a second bit sequence B by encoding a first bit sequence b having forward error correction coding performed on a transmission bit sequence, maps the second bit sequence to a transmission symbol signal, and transmits an optical modulated signal generated by modulating an optical carrier wave into the transmission symbol signal. A symbol output unit (2020) generates a received symbol signal by demodulating an optical modulated signal received by an optical reception apparatus (2000). A first computation unit (2040) computes LLR(Bi) which is a log-likelihood ratio (LLR) of each bit Bi of the second bit sequence, using the received symbol signal. A second computation unit (2060) computes a log-likelihood ratio LLR(bi) of each bit bi of the first bit sequence from the LLR(Bi). A correspondence relationship between each bit of the first bit sequence and each bit of the second bit sequence is used in this computation. A decoding unit (2080) decodes the transmission bit sequence using the LLR(bi).

17 Claims, 8 Drawing Sheets

(51) Int. Cl.
    *H04B 10/61*     (2013.01)
    *H04B 10/69*     (2013.01)
    *H04L 27/36*     (2006.01)
    *H04L 27/38*     (2006.01)
    *H03M 13/29*     (2006.01)
    *H03M 13/11*     (2006.01)

(52) U.S. Cl.
    CPC ........... *H04B 10/616* (2013.01); *H04B 10/69* (2013.01); *H04B 10/695* (2013.01); *H03M 13/1111* (2013.01); *H03M 13/2957* (2013.01); *H04L 27/36* (2013.01); *H04L 27/38* (2013.01)

(58) Field of Classification Search
    CPC ...... H04B 10/695; H04B 10/61; H04B 10/69; H04L 27/36; H04L 27/38
    See application file for complete search history.

(56) References Cited

FOREIGN PATENT DOCUMENTS

| | | |
|---|---|---|
| JP | 2008-153874 A | 7/2008 |
| WO | WO 2015/137049 A1 | 9/2015 |

\* cited by examiner

OPTICAL RECEPTION APPARATUS, SYSTEM, AND CONTROL METHOD

CROSS-REFERENCE TO RELATED PATENT APPLICATIONS

This application is a National Stage Entry of International Application No. PCT/JP2017/015286, filed Apr. 14, 2017, which claims priority from Japanese Patent Application No. 2016-088172, filed Apr. 26, 2016. The entire contents of the above-referenced applications are expressly incorporated herein by reference.

TECHNICAL FIELD

The present invention relates to an optical reception apparatus, a system, and a control method.

BACKGROUND ART

In communication systems, forward error correction coding is often used in order to secure the reliability of communication. Particularly, in large-capacity backbone transmission systems, low-density parity check (LDPC) coding, turbo coding or the like having high error correction capability is used.

It is preferable to use soft decision information in order to sufficiently exhibit the performance of error correction coding such as the above LDPC coding. As the soft decision information, the log-likelihood ratio (LLR) of each bit is used. This log-likelihood ratio is an index representing the likelihood of a value for each bit.

When computing LLR in accordance with its definition, complicated computation is required. Therefore, there is a problem in that the size of a circuit that performs soft decision increases, or electric power required for soft decision increases. Consequently, contrivance for reducing the amount of processing of soft decision has been made.

As one of methods of reducing the amount of processing of soft decision, there is a method of using a look-up table. First, the LLR of each bit is computed in advance with respect to a bit sequence corresponding to each pattern of received symbols and a look-up table is created in advance. When a received signal is processed, an LLR corresponding to a received symbol obtained by modulating the received signal is read out of the look-up table, to thereby perform soft decision. For example, Patent Document 1 discloses a technique in which soft decision is performed using a look-up table, in a receiving apparatus that receives a two-dimensional modulated signal.

RELATED DOCUMENT

Patent Document

[Patent Document 1] PCT Japanese Translation Patent Publication No. 2008-519519

SUMMARY OF THE INVENTION

Technical Problem

In a case where the number of dimensions of modulated signal becomes larger, it becomes difficult to reduce the amount of processing of soft decision. For example, in a case where the number of dimensions of modulation becomes larger, the number of patterns of received symbols becomes larger, and thus the size of a look-up table increases. As a result, it is difficult to reduce the amount of processing of soft decision using the look-up table.

The present invention is contrived in view of the above problem. An object of the present invention is to provide a technique for reducing the amount of processing of soft decision.

Solution to Problem

According to the present invention, there is provided an optical reception apparatus that receives an optical modulated signal transmitted from an optical transmission apparatus.

The optical transmission apparatus generates a second bit sequence by encoding a first bit sequence, and generates and transmits the optical modulated signal by modulating an optical carrier wave on the basis of a transmission symbol signal generated from the second bit sequence, the first bit sequence being a bit sequence having error correction coding performed on a transmission bit sequence. The first bit sequence and the second bit sequence include a plurality of bits.

The optical reception apparatus includes (1) a symbol output unit that acquires the optical modulated signal transmitted by the optical transmission apparatus, and outputs a received symbol signal by demodulating the acquired optical modulated signal, (2) a first computation unit that computes a log-likelihood ratio of each bit of the second bit sequence, using the received symbol signal, (3) a second computation unit that computes a log-likelihood ratio of each bit of the first bit sequence from the log-likelihood ratio of each bit of the second bit sequence, on the basis of a correspondence relationship between each bit of the second bit sequence and each bit of the first bit sequence, and (4) a decoding unit that decodes the transmission bit sequence using the log-likelihood ratio of each bit of the first bit sequence.

At least one bit included in the second bit sequence is computed using two or more bits included in the first bit sequence.

According to the present invention, there is provided a system including the optical transmission apparatus and the optical reception apparatus.

According to the present invention, there is provided a control method which is executed by a computer that receives an optical modulated signal transmitted from an optical transmission apparatus.

The optical transmission apparatus generates a second bit sequence by encoding a first bit sequence, and generates and transmits the optical modulated signal by modulating an optical carrier wave on the basis of a transmission symbol signal generated from the second bit sequence, the first bit sequence being a bit sequence having error correction coding performed on a transmission bit sequence. The first bit sequence and the second bit sequence include a plurality of bits.

The control method includes (1) a symbol output step of acquiring the optical modulated signal transmitted by the optical transmission apparatus, and outputting a received symbol signal by demodulating the acquired optical modulated signal, (2) a first computation step of computing a log-likelihood ratio of each bit of the second bit sequence, using the received symbol signal, (3) a second computation step of computing a log-likelihood ratio of each bit of the first bit sequence from the log-likelihood ratio of each bit of the second bit sequence, on the basis of a correspondence relationship between each bit of the second bit sequence and each bit of the first bit sequence, and (4) a decoding step of decoding the transmission bit sequence using the log-likelihood ratio of each bit of the first bit sequence.

At least one bit included in the second bit sequence is computed using two or more bits included in the first bit sequence.

Advantageous Effects of Invention

According to the present invention, a technique for reducing the amount of processing of soft decision is provided.

BRIEF DESCRIPTION OF THE DRAWINGS

The above and other objects, features and advantages will be made clearer from certain preferred example embodiments described below, and the following accompanying drawings.

DESCRIPTION OF EMBODIMENTS

Figure 1:
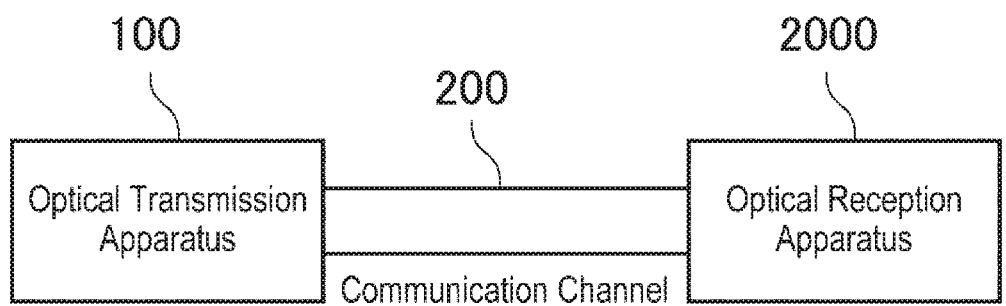
FIG. 1 is a block diagram illustrating an optical reception apparatus of Example Embodiment 1 together with the usage environment.

Hereinafter, example embodiments of the present invention will be described with reference to the accompanying drawings. In all the drawings, like elements are referenced by like reference numerals and the descriptions thereof will not be repeated. In addition, in each block diagram, each block represents a function-based block rather than a hardware-based configuration unless otherwise described.

Example Embodiment 1

<Outline>

FIG. 1 is a block diagram illustrating an optical reception apparatus 2000 of Example Embodiment 1 together with the usage environment. The optical reception apparatus 2000 of Example Embodiment 1 is connected to an optical transmission apparatus 100 through a communication channel 200. The optical reception apparatus 2000 receives an optical modulated signal transmitted by the optical transmission apparatus 100 through the optical transmission apparatus 100.

The optical transmission apparatus 100 generates a first bit sequence b={b1, b2, . . . , bn} by performing forward error correction coding (such as LDPC coding or turbo coding) on a bit sequence (transmission bit sequence) a={a1, a2, . . . , ak} representing data which is transmitted to the optical reception apparatus 2000. Here, both k and n are integers equal to or greater than 2. That is, both the transmission bit sequence and the first bit sequence include a plurality of bits.

Next, the optical transmission apparatus 100 encodes the first bit sequence b into a second bit sequence B={B1, B2, . . . , Bm}. Here, m is an integer equal to or greater than 2. That is, the second bit sequence includes a plurality of bits.

Further, the optical transmission apparatus 100 performs symbol mapping on the encoded second bit sequence B to a transmission symbol signal S={S1, S2, . . . , Sp}, and modulates optical carrier waves to the transmission symbol signal S, to thereby generate an optical modulated signal. Here, p is integer equal to or greater than 2. That is, the transmission symbol signal is a signal of two or more dimensions.

Figure 2:
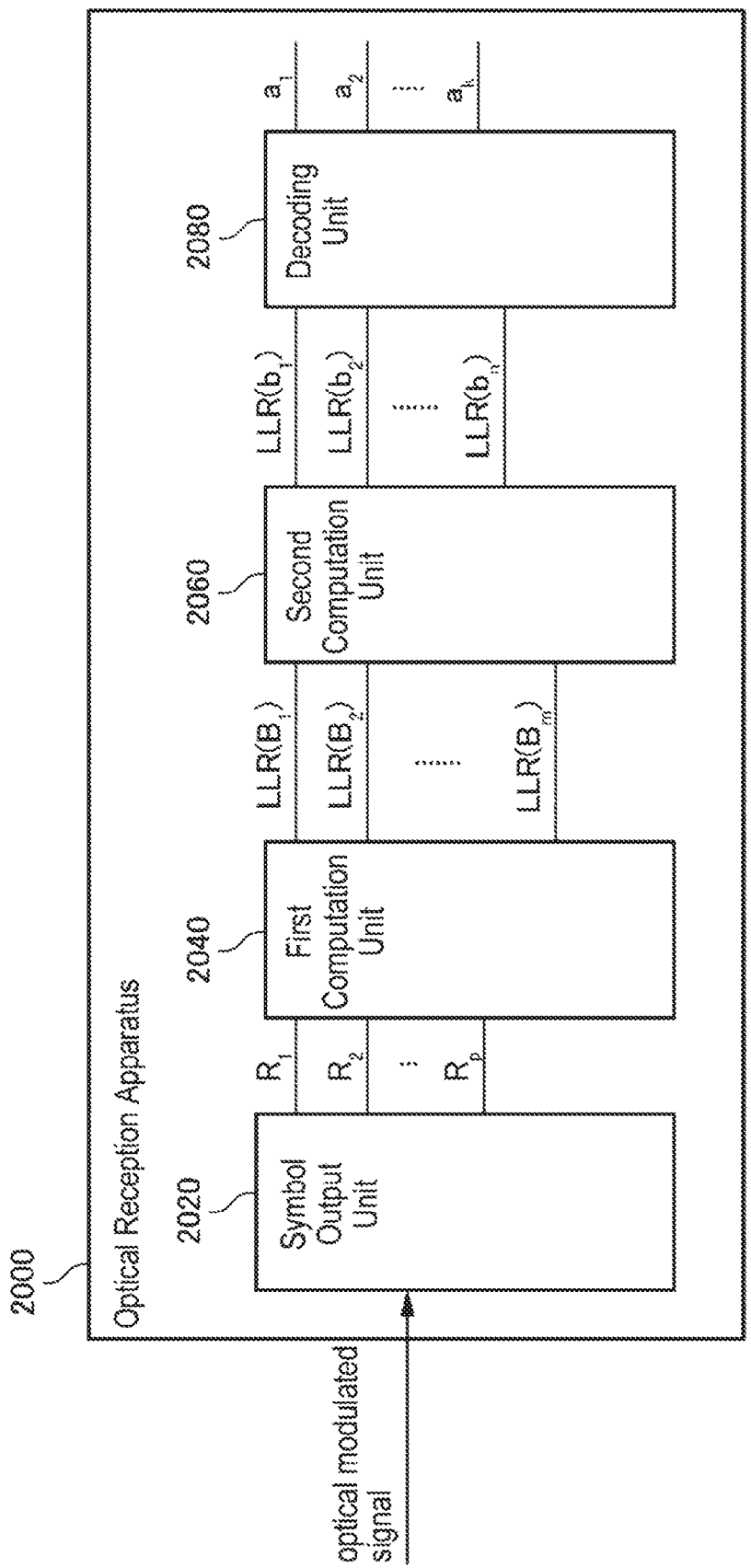
FIG. 2 is a diagram illustrating a configuration of the optical reception apparatus.

FIG. 2 is a diagram illustrating a configuration of the optical reception apparatus 2000. The optical reception apparatus 2000 includes a symbol output unit 2020, a first computation unit 2040, a second computation unit 2060, and a decoding unit 2080.

The optical reception apparatus 2000 receives the optical modulated signal transmitted by the optical transmission apparatus 100. The symbol output unit 2020 demodulates the optical modulated signal received by the optical reception apparatus 2000, to thereby generate a received symbol signal R={R1, R2, . . . , Rp} and output this received symbol signal R.

The first computation unit 2040 computes LLR(Bi) which is a log-likelihood ratio (LLR) of each bit Bi of the second bit sequence, using the received symbol signal R which is output by the symbol output unit 2020.

The second computation unit 2060 computes the log-likelihood ratio LLR(bi) of each bit bi of the first bit sequence from the log-likelihood ratio LLR(Bi) of each bit Bi of the second bit sequence computed by the first computation unit 2040. A correspondence relationship between the each bit of the first bit sequence and each bit of the second bit sequence is used in this computation.

The decoding unit 2080 decodes the transmission bit sequence using the log-likelihood ratio LLR(bi) of each bit bi of the first bit sequence computed by the second computation unit 2060.

The symbol output unit 2020, the first computation unit 2040, the second computation unit 2060, and the decoding unit 2080 are implemented using, for example, one or more large-scale integration (LSI) circuits or the like. For example, these functional configuration units are implemented using individual LSI circuits. In addition, for example, these functional configuration units may be implemented using one LSI circuit.

Hereinafter, further details of the present example embodiment will be described.

<Flow of Processes>

Figure 3:
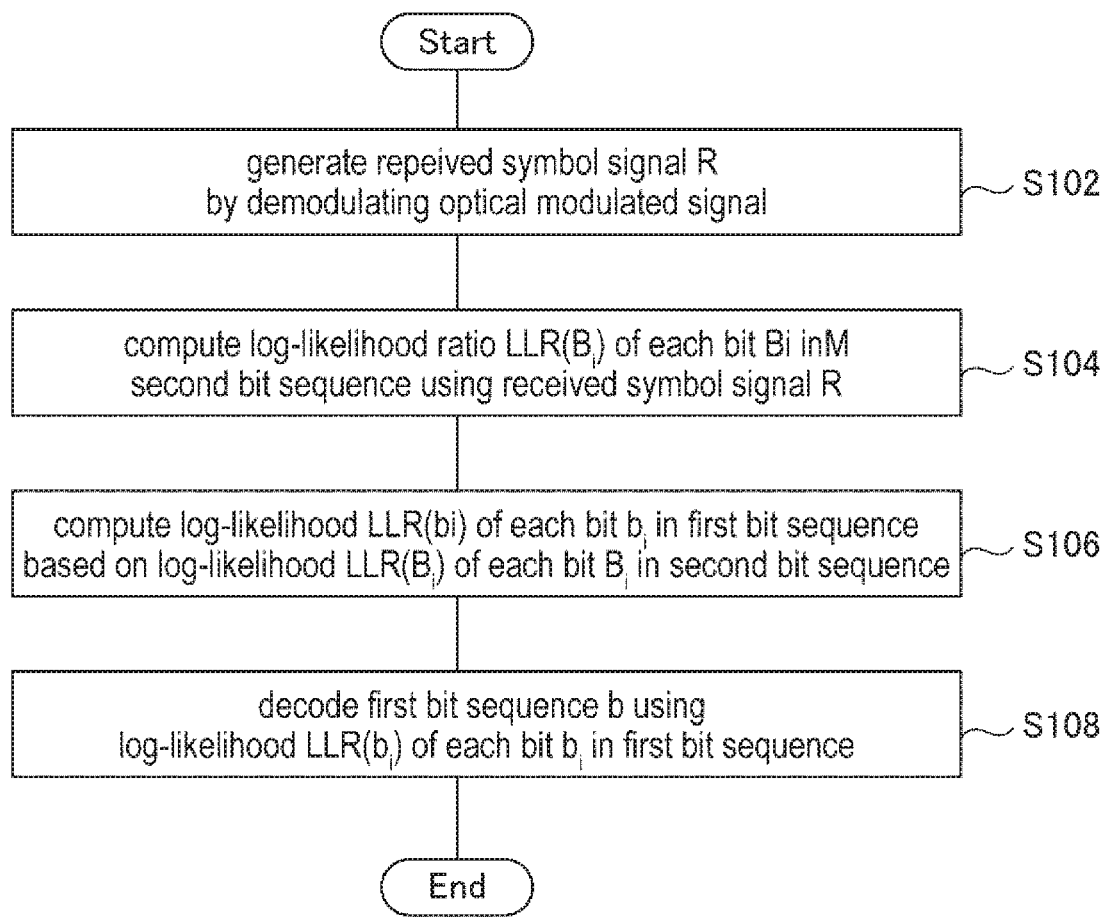
FIG. 3 is a flow diagram illustrating a flow of processes which are executed by the optical reception apparatus of Example Embodiment 1.

FIG. 3 is a flow diagram illustrating a flow of processes which are executed by the optical reception apparatus 2000 of Example Embodiment 1. The symbol output unit 2020 demodulates an optical modulated signal and generates a received symbol signal R (S102). The first computation unit 2040 computes the log-likelihood ratio LLR(Bi) of each bit Bi of the second bit sequence, using the received symbol signal R which is output by the symbol output unit 2020 (S104). The second computation unit 2060 computes the log-likelihood ratio LLR(bi) of each bit bi of the first bit sequence from the log-likelihood ratio LLR(Bi) of each bit Bi of the second bit sequence computed by the first computation unit 2040 (S106). The decoding unit 2080 decodes the transmission bit sequence through forward error correction coding, using the log-likelihood ratio LLR(bi) of each bit bi of the first bit sequence computed by the second computation unit 2060 (S108).

<Generation of Received Symbol Signal (S102)>

The symbol output unit 2020 demodulates an optical modulated signal and generates a received symbol signal R. Here, the optical modulated signal is a signal generated by modulating an optical carrier wave using the transmission symbol signal in the optical transmission apparatus 100. Consequently, first, the transmission symbol signal which is a premise for describing the received symbol signal will be described.

The transmission symbol signal is represented by a p-dimensional data sequence S={S1, S2, ..., Sp} (p is a positive integer). Here, the transmission symbol signal represented by a p-dimensional data sequence is also called a p-dimensional transmission symbol signal. The transmission symbol signal S can be set to, for example, a data sequence based on at least one dimension out of dimensions of the optical phase (I component and Q component), polarization (X polarization component and Y polarization component), wavelength, and time of an optical carrier wave.

For example, a two-dimensional transmission symbol signal can be configured as a data sequence S={Isx, Qsx} using the optical phase of the X polarization component of an optical carrier wave. Here, Isx and Qsx represent the I component and the Q component of the X polarization component of an optical modulated signal, respectively, transmitted by the optical transmission apparatus 100. In addition, for example, a four-dimensional transmission symbol signal can be configured as a data sequence S={Isx, Qsx, Isy, Qsy} using the optical phase and polarization of an optical carrier wave. Here, Isy and Qsy represent the I component and the Q component of the Y polarization component of an optical modulated signal, respectively, transmitted by the optical transmission apparatus 100.

The optical transmission apparatus 100 maps the second bit sequence Bi to a transmission symbol signal. A rule of mapping the second bit sequence B to the transmission symbol signal S is assumed to be determined in advance.

Here, the rule of mapping the second bit sequence to the transmission symbol signal is arbitrary. Hereinafter, the rule of mapping the second bit sequence to the transmission symbol signal will be illustrated.

Figure 4:
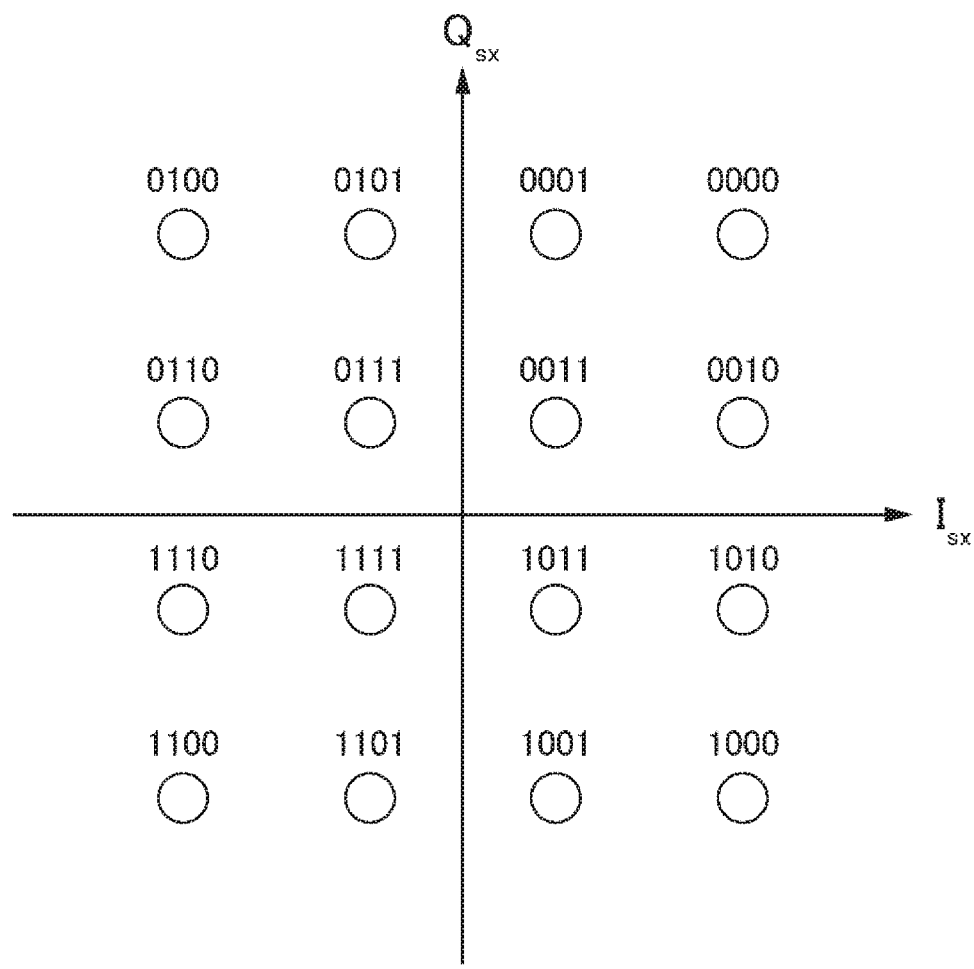
FIG. 4 is a diagram illustrating mapping of a bit sequence {B1, B2, B3, B4} for an X polarization component of a transmission symbol signal.

The second bit sequence is assumed to be an 8-bit bit sequence {B1, B2, ..., B8}. In addition, the second bit sequence is assumed to be mapped to the four-dimensional transmission symbol signal S={Irx, Qrx, Iry, Qry}. In this case, for example, in the second bit sequence, a bit sequence {B1, B2, B3, B4} is mapped to the X polarization component of an optical modulated signal, and a bit sequence {B5, B6, B7, B8} is mapped to the Y polarization component of the optical modulated signal. More specifically, a bit sequence {B1, B2} is mapped to the I component (Isx) of the X polarization component of the optical modulated signal, a bit sequence {B3, B4} is mapped to the Q component (Qsx) of the X polarization component of the optical modulated signal, a bit sequence {B5, B6} is mapped to the I component (Isy) of the Y polarization component of the optical modulated signal, and a bit sequence {B7, B8} is mapped to the Q component (Qsy) of the Y polarization component of the optical modulated signal. FIG. 4 is a diagram illustrating mapping of the bit sequence {B1, B2, B3, B4} for the X polarization component of a transmission symbol signal. Note that mapping of the bit sequence {B5, B6, B7, B8} for the Y polarization component of the transmission symbol signal is also the same as mapping shown in FIG. 4.

The configuration of the received symbol signal corresponds to the configuration of the transmission symbol signal. For example, in a case where the transmission symbol signal is a two-dimensional data sequence (S={Isx, Qsx}) using the optical phase of the X polarization component of an optical carrier wave, the received symbol signal is also set to a two-dimensional data sequence (R={Irx, Qrx}) using the optical phase of the X polarization component of the optical carrier wave. Here, Irx and Qrx represent the I component and the Q component of the X polarization component of an optical modulated signal, respectively, received by the optical reception apparatus 2000. Similarly, in a case where the transmission symbol signal is a four-dimensional data sequence (S={Isx, Qsx, Ixy, Qsy}) using the optical phase and polarization of the optical carrier wave, the received symbol signal is also set to a four-dimensional data sequence (R={Irx, Qrx, Iry, Qry}) of the optical phase and polarization of the optical carrier wave. Here, Iry and Qry represent the I component and the Q component of the Y polarization component of the optical modulated signal, respectively, received by the optical reception apparatus 2000.

A process which is performed by the symbol output unit 2020 is a process for restoring, from the optical modulated signal, a transmission symbol signal used in the generation of that optical modulated signal. Therefore, a method in which the symbol output unit 2020 generates a received symbol signal from the optical modulated signal depends on a method in which the optical transmission apparatus 100 modulates an optical carrier wave into a transmission symbol signal and generates an optical modulated signal. Various existing techniques can be used in a method of modulating an optical carrier wave using a transmission symbol signal or a method of demodulating an optical modulated signal corresponding thereto.

<Method of Compute Log-Likelihood Ratio of Each Bit of Second Bit Sequence: S104>

The first computation unit 2040 computes the log-likelihood ratio of each bit of the second bit sequence, using the received symbol signal (S104). Here, the log-likelihood ratio of each bit of the second bit sequence is defined by the following Expression (1). Bi represents an i-th bit in the second bit sequence. R represents the received symbol signal.

$$LLR(B_i) = \log\left(\frac{P(B_i = 1 \mid R)}{P(B_i = 0 \mid R)}\right) \quad (1)$$

Here, it is assumed that the transmission symbol signal and the received symbol signal are two-dimensional and have Gaussian noise of dispersion a added thereto in the communication channel 200. Under this assumption, Expression (1) can be rearranged like the following Expression (2). Here, it is assumed that the transmission symbol signal is represented by S=is+j*qs, and that the received symbol signal is represented by R=ir+j*qr (j is an imaginary unit).

$$LLR(B_i) = \log\left(\frac{\sum_{s \in C_i^1} \exp\left(\frac{-\{(i_r - i_s)^2 + (q_r - q_s)^2\}}{2\sigma^2}\right)}{\sum_{s \in C_i^0} \exp\left(\frac{-\{(i_r - i_s)^2 + (q_r - q_s)^2\}}{2\sigma^2}\right)}\right) \quad (2)$$

Since Expression (2) includes log and exp, complicated circuit implementation is required in a case of being mounted in an LSI circuit or the like. Therefore, it is preferable to simplify computation using some kind of method. For example, ir and qr are rounded and discretized with appropriate accuracy during the computation of the log-likelihood ratio. Here, values obtained by discretizing ir and qr are set to Ir and Qr, respectively. The value of Expression (2) is computed with respect to each combination of the discretized (Ir, Qr), and is stored in a storage device in advance. Specifically, this storage device stores a look-up table in which a set of (Ir, Qr) and the value of a log-likelihood ratio corresponding to the set are associated with each other. The first computation unit 2040 refers to the look-up table using the received symbol signal, to thereby acquire LLR(Bi) corresponding to the acquired received symbol signal.

However, the first computation unit 2040 may not use the look-up table in the computation of the LLR(Bi). In this case, the first computation unit 2040 computes the LLR(Bi) by inputting the received symbol signal to Expression (2) described above or an expression obtained by simplifying this expression. Note that Expression (2) described above or an expression obtained by simplifying this expression is implemented using, for example, an LSI circuit or the like.

Here, it is preferable that mapping of the second bit sequence for the transmission symbol signal is performed so that the value of each bit of the second bit sequence is determined by information of a lower dimension than the number of dimensions of the transmission symbol signal. For example, in a case of mapping shown in FIG. 4, the value of each bit of the second bit sequence is determined by any one element within four elements of Isx. Qsy, Isy, and Qsy included in the four-dimensional transmission symbol signal.

Figure 5:
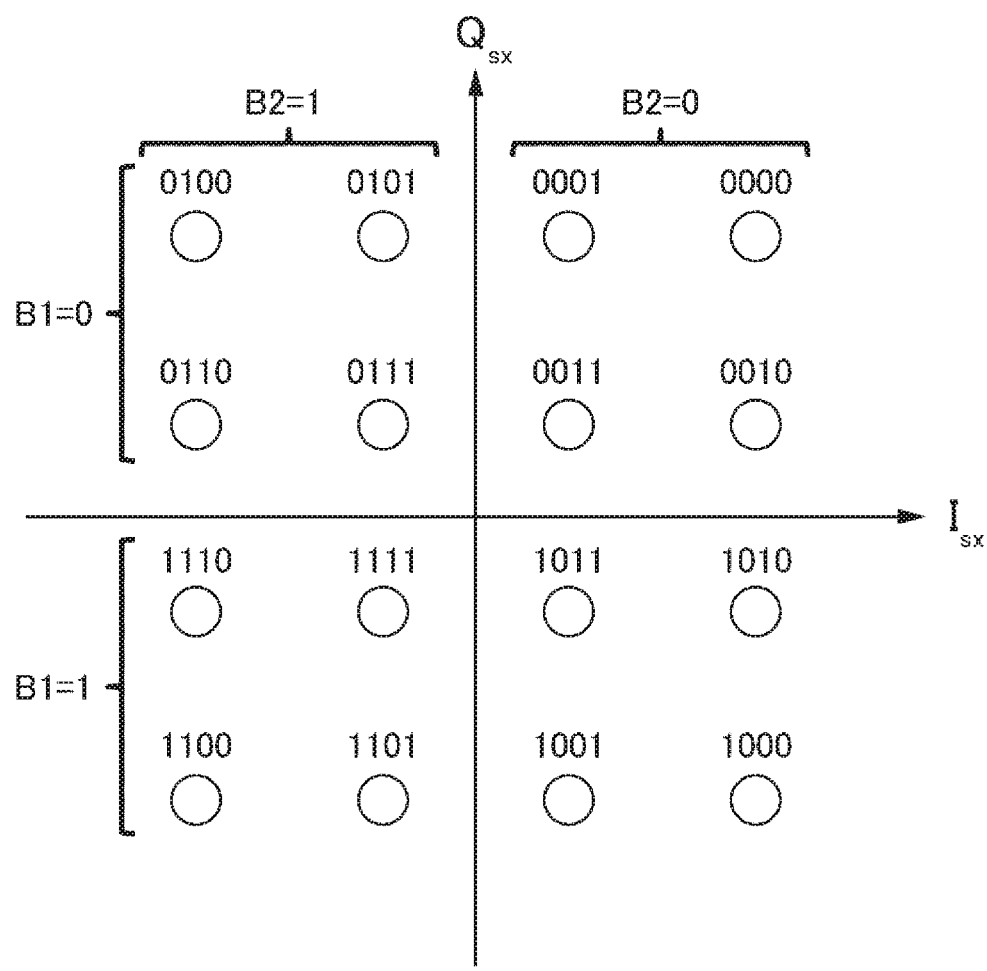
FIG. 5 is a diagram representing that each bit of a second bit sequence is determined by one element included in the transmission symbol signal.

FIG. 5 is a diagram representing that each bit of the second bit sequence is determined by one element included in the transmission symbol signal. As shown in FIG. 5, the value of B1 is determined by only Qsx. In addition, the value of B2 is determined by only Isx. Note that, although not shown in the drawing, B3 is determined by only Qsx, and B4 is determined by only Isx.

In this manner, there is an advantage in that, mapping is performed so that Bi can be determined by information of a lower dimension than the number of dimensions of the received symbol signal, thereby allowing the LLR(Bi) to be accurately obtained with simple computation as compared with a case where the value of each bit of the second bit sequence is dependent on all the elements the received symbol signal. In addition, there is an advantage in that, in a case where the value of the LLR(Bi) is computed in advance and is stored in the look-up table, the size of the look-up table becomes smaller.

Here, it is assumed that prohibition logic is included in a rule of encoding for generating the second bit sequence B from the first bit sequence b. The prohibition logic means a pattern of logic which is not able to be represented as the second bit sequence, according to the rule of encoding. In a case where the prohibition logic is present in the second bit sequence in this manner, the occurrence probability of each pattern of the received symbol signal is not uniform. Consequently, in the computation of the log-likelihood ratio LLB (Bi) of each bit of the second bit sequence, it is preferable that weighting is performed in consideration of this occurrence probability. Note that a specific example of the prohibition logic or the details of weighting considering the occurrence probability of each pattern of the received symbol signal will be described later.

<Log-Likelihood Ratio of Each Bit of First Bit Sequence: S106>

The second computation unit 2060 computes the log-likelihood ratio of each bit of the first bit sequence from the log-likelihood ratio of each bit of the second bit sequence (S106). Here, this computation is performed on the basis of a correspondence relationship between each bit of the first bit sequence and each bit of the second bit sequence.

As described above, the second bit sequence is generated by encoding the first bit sequence. Therefore, each bit of the first bit sequence and each bit of the second bit sequence are associated with each other by this rule of encoding. Thus, a relationship between the log-likelihood ratio of each bit of the first bit sequence and the log-likelihood ratio of each bit of the second bit sequence can be determined on the basis of this rule of the encoding. Hereinafter, a description will be given using a specific example.

Expression (3) shows a specific example of the rule of encoding in which the optical transmission apparatus 100 generates the second bit sequence from the first bit sequence. Note that, in the rule of Expression (3), the order of B1 to B8 in the second bit sequence can be arbitrarily changed. In addition, the rule of encoding shown in Expression (3) is merely an example, and the rule of encoding is not limited to this example.

$$b_7 = b_1 \oplus b_2 \oplus b_3 \oplus b_4 \oplus b_5 \oplus b_6$$

$$B_i = b_i (i=1,2,5, \text{ or } 6)$$

$$B_3 = b_3 + b_4 \overline{b_7}$$

$$B_4 = \overline{b_3} + \overline{b_4} b_7$$

$$B_7 = b_4 + \overline{b_3} b_7$$

$$B_8 = \overline{b_4} + b_3 b_7 \quad (3)$$

In this example, the first bit sequence b is a 6-bit bit sequence {b1, b2, . . . , b6}. In addition, the second bit sequence B is an 8-bit bit sequence (B1, B2, . . . , B8).

First b7 is computed as an exclusive OR of all the bits of the bit sequence b. The value of each bit of the second bit sequence B is computed on the basis of the first bit sequence {b1, . . . , b6} and the value of b7. Note that the values of B1, B2, B5, and B6 are set to the values themselves of bi, b2, b5, and b6, respectively.

According to the rule of encoding shown in Expression (3), bits B3, B4, B7, and B8 included in the second bit sequence are computed by performing an AND operation or an OR operation on two or more bits included in the first bit sequence. Thus, the second bit sequence becomes a non-linear code. In addition, according to the rule of encoding shown in Expression (3), the first bit sequence includes bits that are not output as they are in the first bit sequence. Specifically, b3 and b4 are not output as they are as the second bit sequence (b1, b2, b5, and b6 are output as they are as B1, B2, B5, and B6, respectively) since B3 and B4 are different from b3 and b4. Thus, the second bit sequence is a non-systematic code.

Note that there is a second bit sequence which is not able to be generated from the rule of encoding shown in Expression (3). Specifically, a second bit sequence including "{0000}, {0001}, {0010}, {0011}, {0100}, {1000}, {1100}, or {1111}" as {B3, B4, B7, B8} is not able to be presenthereinafter, the pattern of {B3, B4, B7, B8} which is not able to be present in this manner is called prohibition logic.

A rule (hereinafter, called a rule of inverse transformation) of generating the first bit sequence from the second bit sequence can be derived on the basis of the rule of encoding shown in Expression (3). Expression (4) is an example of the rule of inverse transformation corresponding to the rule of encoding shown in Expression (3).

$$b_i = B_i (i=1,2,5, \text{ or } 6)$$

$$b_3(1) = B_3(\overline{B_7}B_8 + \overline{B_4}B_7)$$

$$b_3(0) = B_4(\overline{B_3}B_8 + B_7\overline{B_8})$$

$$b_4(1) = B_7(B_4\overline{B_8} + B_3\overline{B_4})$$

$$b_4(0) = B_8(\overline{B_3}B_4 + B_3\overline{B_7}) \quad (4)$$

As described herein, the prohibition logic is present in the rule of encoding of Expression (3). Due to the presence of this prohibition logic, logic expressions for b3 and b4 have different logic expressions, respectively, with respect to logic (0-logic) for bi=0 and logic (1-logic) for bi=1. In addition, b3(0) is 0-logic, and the value of b3 is set to 0 in a case where the value of b3(0) on the right side is 1. On the other hand, b3(1) is 1-logic, and the value of b3 is set to 1 in a case where the value of b3(1) on the right side is 1. That is, the second computation unit 2060 outputs 0 as the value of b3 in a case of b3(0)=1, and outputs 1 as the value of b3 in a case of b3(1)=1. Note that, due to the presence of the prohibition logic, any one of b3(0) and b3(1) necessarily becomes 1.

Similarly, b4(0) is 0-logic, and the value of b4 is set to 0 in a case where the value of b4(0) on the right side is 1. On the other hand, b4(1) is 1-logic, and the value of b4 is set to 1 in a case where the value of b4(1) on the right side is 1. That is, the second computation unit 2060 outputs 0 as the value of b4 in a case of b4(0)=1, and outputs 1 as the value of b4 in a case of b4(1)=1. Due to the presence of the prohibition logic, any one of b4(0) and b4(1) necessarily becomes 1.

An expression for computing the log-likelihood ratio of each bit of the first bit sequence from the log-likelihood ratio of each bit of the second bit sequence can be derived on the basis of the definition of the rule of inverse transformation shown in Expression (4) and the log-likelihood ratio shown in Expression (1). Hereinafter, a deriving method and a derived expression are shown.

First, Expression (5) is derived by rearranging Expression (1).

$$LLR(b_i) = \log\left(\frac{P(b_i=1 \mid R)}{P(b_i=0 \mid R)}\right) \quad (5)$$

$$= \log\left(\frac{P(b_i=1 \mid R)}{1-P(b_i=1 \mid R)}\right)$$

In addition, Expression (6) and Expression (7) are derived from Expression (5).

$$P(b_i=1 \mid R) = \frac{\exp(LLR(b_i))}{1+\exp(LLR(b_i))} \quad (6)$$

$$P(b_i=0 \mid R) = \frac{1}{1+\exp(LLR(b_i))} \quad (7)$$

Here, from Expression (3), the establishment of b3=1 corresponds to a case of B3B7B8=101 or B3B4B7=101. Therefore, the probability of being b3=1 in a case where the received symbol signal R is received is represented by the following Expression (8).

$$P(b_3=1 \mid R) = P(B_3B_7B_8=101 \mid R) + P(B_3B_4B_7=101 \mid R) \quad (8)$$

$$= P(B_3=1 \mid R)P(B_7=0 \mid R)P(B_8=1 \mid R) +$$

$$P(B_3=1 \mid R)P(B_4=0 \mid R)P(B_7=1 \mid R)$$

Further, Expression (9) is derived by applying Expression (6) and Expression (7) to Expression (8).

$$P(b_3=1 \mid R) = \frac{e^{LLR(B_3)}}{1+e^{LLR(B_3)}} \quad (9)$$

$$\left(\frac{1}{1+e^{LLR(B_7)}} \frac{e^{LLR(B_8)}}{1+e^{LLR(B_8)}} + \frac{1}{1+e^{LLR(B_4)}} \frac{e^{LLR(B_7)}}{1+e^{LLR(B_7)}}\right)$$

$$= e^{LLR(B_3)}$$

$$\frac{e^{LLR(B_8)}(1+e^{LLR(B_4)}) + e^{LLR(B_7)}(1+e^{LLR(B_8)})}{(1+e^{LLR(B_3)})(1+e^{LLR(B_4)})(1+e^{LLR(B_7)})(1+e^{LLR(B_8)})}$$

Similarly, the probability of being b3=0 in a case where the received symbol signal R is received is represented by the following Expression (10).

$$P(b_3=0 \mid R) = e^{LLR(B_4)} \frac{e^{LLR(B_8)}(1+e^{LLR(B_7)}) + e^{LLR(B_7)}(1+e^{LLR(B_3)})}{(1+e^{LLR(B_3)})(1+e^{LLR(B_4)})} \quad (10)$$

$$(1+e^{LLR(B_7)})(1+e^{LLR(B_8)})$$

The expression (Expression (11)) of LLR(b3) is derived as follows by applying Expression (9) and Expression (10) to Expression (1) which is a definition expression of LLR.

$$LLR(b_3) = \log\left(\frac{P(b_3=1 \mid R)}{P(b_3=0 \mid R)}\right) \quad (11)$$

$$= LLR(B_3) - LLR(B_4) + \log$$

$$\frac{e^{LLR(B_8)}(1+e^{LLR(B_4)} + e^{LLR(B_7)}) + e^{LLR(B_7)}}{e^{LLR(B_7)}(1+e^{LLR(B_3)} + e^{LLR(B_8)}) + e^{LLR(B_8)}}$$

Here, a lot of log or exp is included in Expression (11). Therefore, when Expression (11) is implemented in the second computation unit 2060, it is preferable to simplify Expression (11). For example, Expression (11) can be simplified like Expression (12) by using a max-sum algorithm in which a maximum value is used instead of the computation of the sum.

$$LLR(b_3) = LLR(B_3) - LLR(B_4) + \quad (12)$$

$$\max(LLR(B_8) + \max(0, e^{LLR(B_4)}, e^{LLR(B_7)}), e^{LLR(B_7)}) -$$

$$\max(LLR(B_7) + \max(0, e^{LLR(B_3)} \cdot e^{LLR(B_8)}), e^{LLR(B_8)})$$

In a similar method, the expression of LLR(b4) can also be derived. Specifically, the expression of the LLR(b4) is set to the following Expression (13).

$$LLR(b_4) = LLR(B_7) - LLR(B_8) + \qquad (13)$$
$$\max(LLR(B_3) + \max(0, e^{LLR(B_4)}, e^{LLR(B_8)}), e^{LLR(B_4)}) -$$
$$\max(LLR(B_4) + \max(0, e^{LLR(B_3)}, e^{LLR(B_7)}), e^{LLR(B_3)})$$

As described above, the expression of the LLR(bi) is represented by the following Expression (14).

$$\bullet LLR(b_i) = LLR(B_i) \ (i = 1, 2, 5, \text{ or } 6) \qquad (14)$$
$$\bullet LLR(b_3) = LLR(B_3) - LLR(B_4) +$$
$$\max(LLR(B_8) + \max(0, e^{LLR(B_4)}, e^{LLR(B_7)}), e^{LLR(B_7)}) -$$
$$\max(LLR(B_7) + \max(0, e^{LLR(B_3)}, e^{LLR(B_8)}), e^{LLR(B_8)})$$
$$\bullet LLR(b_4) = LLR(B_7) - LLR(B_8) +$$
$$\max(LLR(B_3) + \max(0, e^{LLR(B_4)}, e^{LLR(B_8)}), e^{LLR(B_4)}) -$$
$$\max(LLR(B_4) + \max(0, e^{LLR(B_3)}, e^{LLR(B_7)}), e^{LLR(B_3)})$$

In this manner, each LLR(bi) can be computed using the LLR(Bi) which is output by the first computation unit 2040.

<Decoding of Transmission Bit Sequence: S108>

The decoding unit 2080 decodes the transmission bit sequence on the basis of the log-likelihood ratio of each bit of the first bit sequence (computes the transmission bit sequence). Here, a known technique of soft decision decoding can be used in a method of decoding a bit sequence before error correction coding is performed, on the basis of the log-likelihood ratio of a bit sequence after the error correction coding is performed. Therefore, a specific description of this technique will not be described.

EXAMPLE

Hereinafter, a specific operation of the optical reception apparatus 2000 of Example Embodiment 1 will be described in an example.

Figure 6:
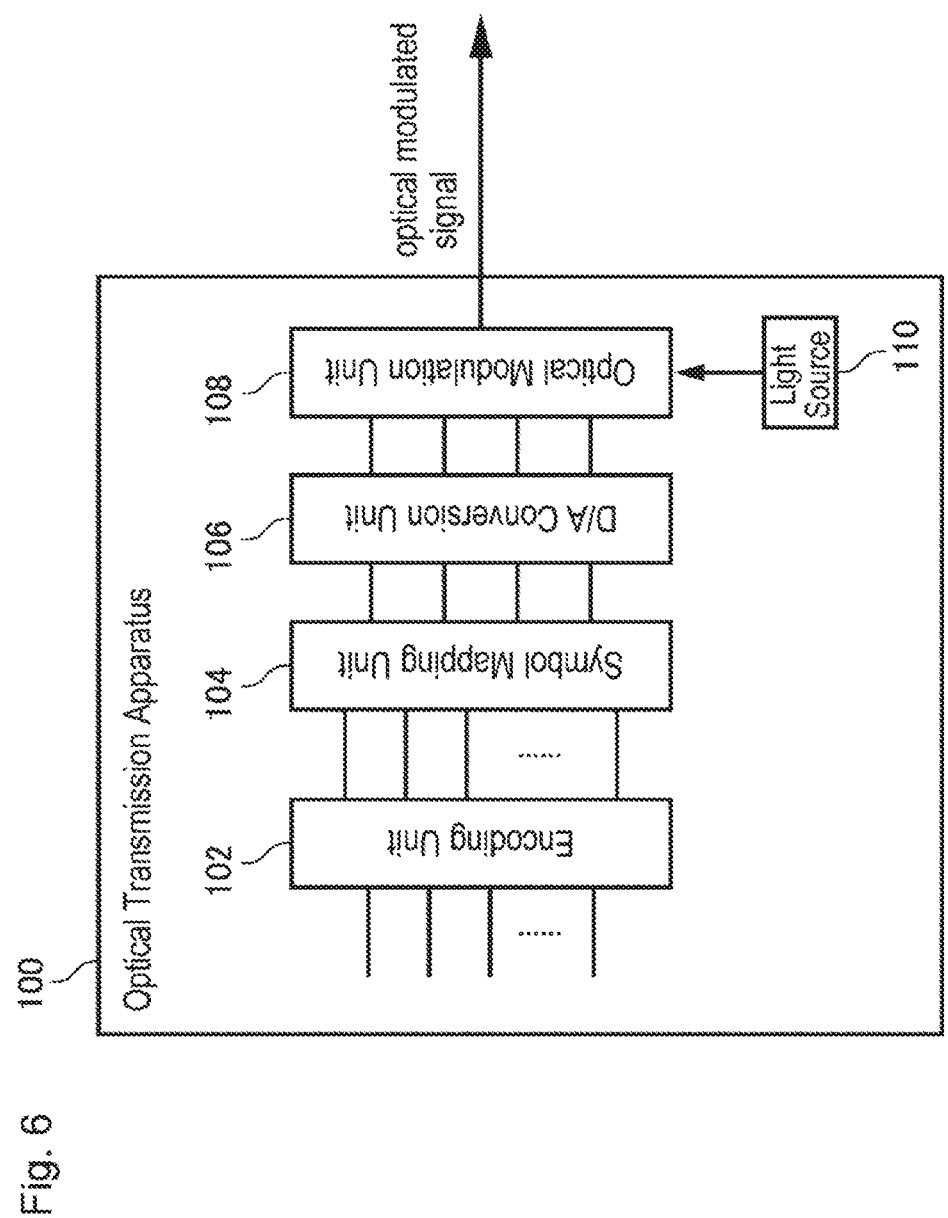
FIG. 6 is a block diagram illustrating a configuration of an optical transmission apparatus in the present example.

FIG. 6 is a block diagram illustrating a configuration of the optical transmission apparatus 100 in the present example. The optical transmission apparatus 100 includes an encoding unit 102, a symbol mapping unit 104, a digital/analog conversion unit 106, an optical modulation unit 108, and a light source 110. The first bit sequence b, in which the error correction coding is performed on the transmission bit sequence a, is input to the encoding unit 102. The encoding unit 102 encodes the first bit sequence b, and generates a second bit sequence B. Here, the encoding unit 102 performs encoding in accordance with the above-described rule of encoding represented by Expression (3). The symbol mapping unit 104 maps the second bit sequence B to the four-dimensional transmission symbol signal S={Irx, Qrx, Iry, Qry}, using the method illustrated in Example Embodiment 1 (see FIG. 4). Note that, as described, mapping of {B5, B6. B7, B8} for Y polarization is the same as that in FIG. 4.

The digital/analog conversion unit 106 converts a digital signal (transmission symbol signal) which is output from the symbol mapping unit 104 into an analog signal. The optical modulation unit 108 generates an optical modulated signal by modulating laser light which is output from the light source 110, using the analog signal which is output from the digital/analog conversion unit 106. Here, the light source 110 is, for example, a laser oscillator, and oscillates laser light serving as an optical carrier wave.

Figure 7:
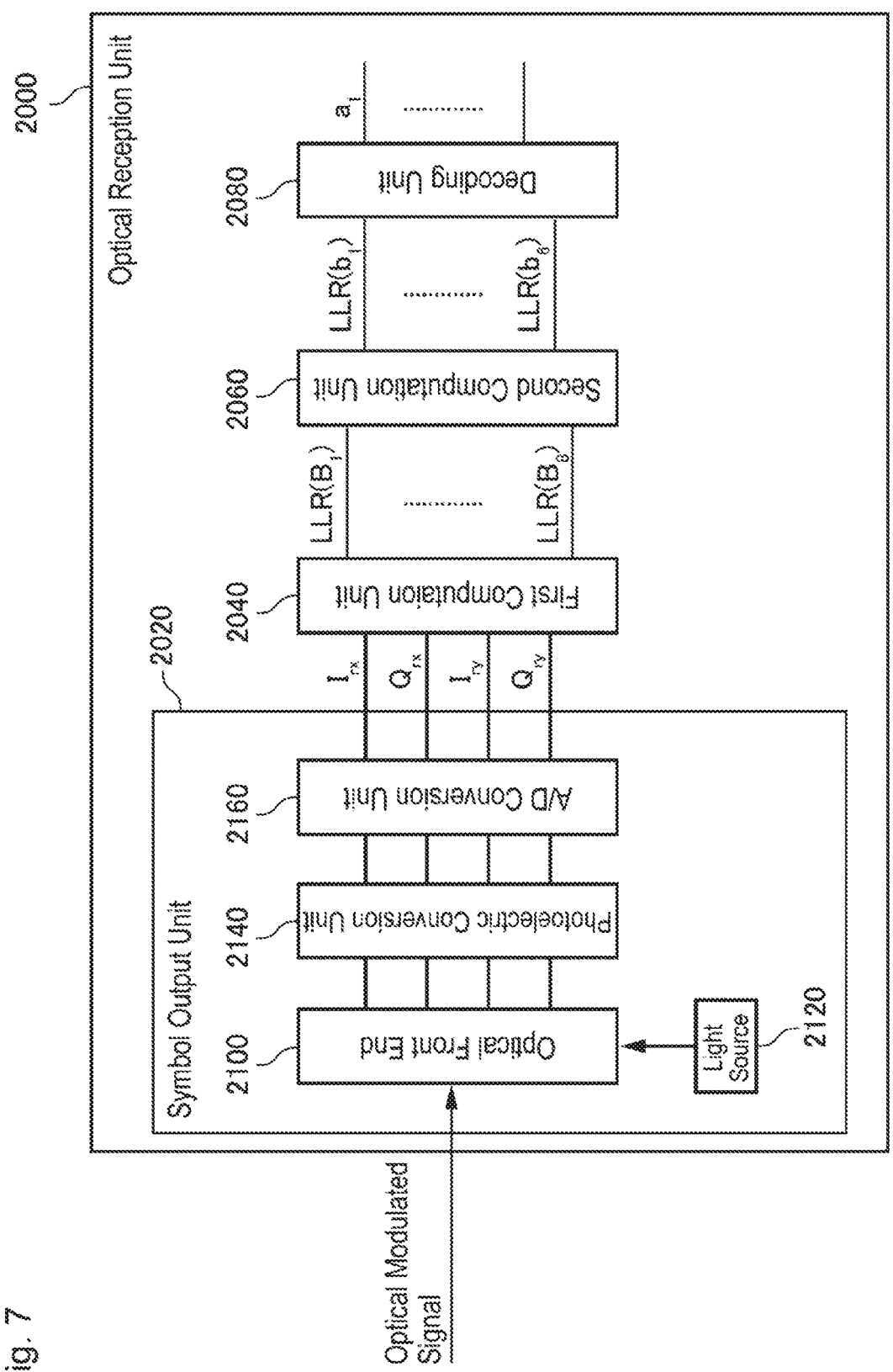
FIG. 7 is a diagram illustrating a configuration of an optical reception apparatus of the present example.

FIG. 7 is a diagram illustrating a configuration of the optical reception apparatus 2000 of the present example. In FIG. 7, the internal configuration of the symbol output unit 2020 is shown. Specifically, the symbol output unit 2020 includes an optical front end 2100, a light source 2120, a photoelectric conversion unit 2140, and an analog/digital conversion unit 2160.

The optical front end 2100 separates the optical modulated signal into two polarization components, and generates a plurality of output light beams by causing the separated components to interfere with local light which is output from the light source 2120 for each component. The light source 2120 is, for example, a laser oscillator, and oscillates local light. The local light has the same frequency as that of laser light which is oscillated from the light source 110 of the optical transmission apparatus 100.

The photoelectric conversion unit 2140 photoelectrically converts a plurality of output light beams which are output from the optical front end 2100, and outputs a plurality of analog signals. The analog/digital conversion unit 2160 converts each of the plurality of analog signals which are output from the photoelectric conversion unit 2140 into a digital signal. The digital signal which is output by the analog/digital conversion unit 2160 represents the received symbol signal R={Irx, Qrx, Iry, Qry}.

Note that the symbol output unit 2020 may perform wavelength dispersion compensation, polarization dispersion compensation or the like on the digital signal which is output from the analog/digital conversion unit 2160, and output, as the received symbol signal R, a digital signal obtained as a result.

The first computation unit 2040 computes LLR(Bi) with respect to each bit of the second bit sequence B, on the basis of this received symbol signal R. Specifically, the first computation unit 2040 obtains the LLR(Bi) by referring to the look-up table of the LLR(Bi) using the received symbol signal R. Here, the first computation unit 2040 of the present example is implemented as an LSI circuit, and gives {Irx, Qrx, Iry, Qry} constituting the received symbol signal R to an input of this LSI circuit, whereby each LLR(Bi) is output from this LSI circuit.

Note that, according to mapping from the second bit sequence in the present example to the transmission symbol signal, as described with reference to FIG. 5, each of the values of bits of the second bit sequence is determined by any one within four elements (Irx, Qrx, Iry, and Qry) of the received symbol signal. Thus, the size of the look-up table is smaller than in a case where the value of each bit of the second bit sequence is dependent on all the elements of the received symbol signal.

Figure 8:
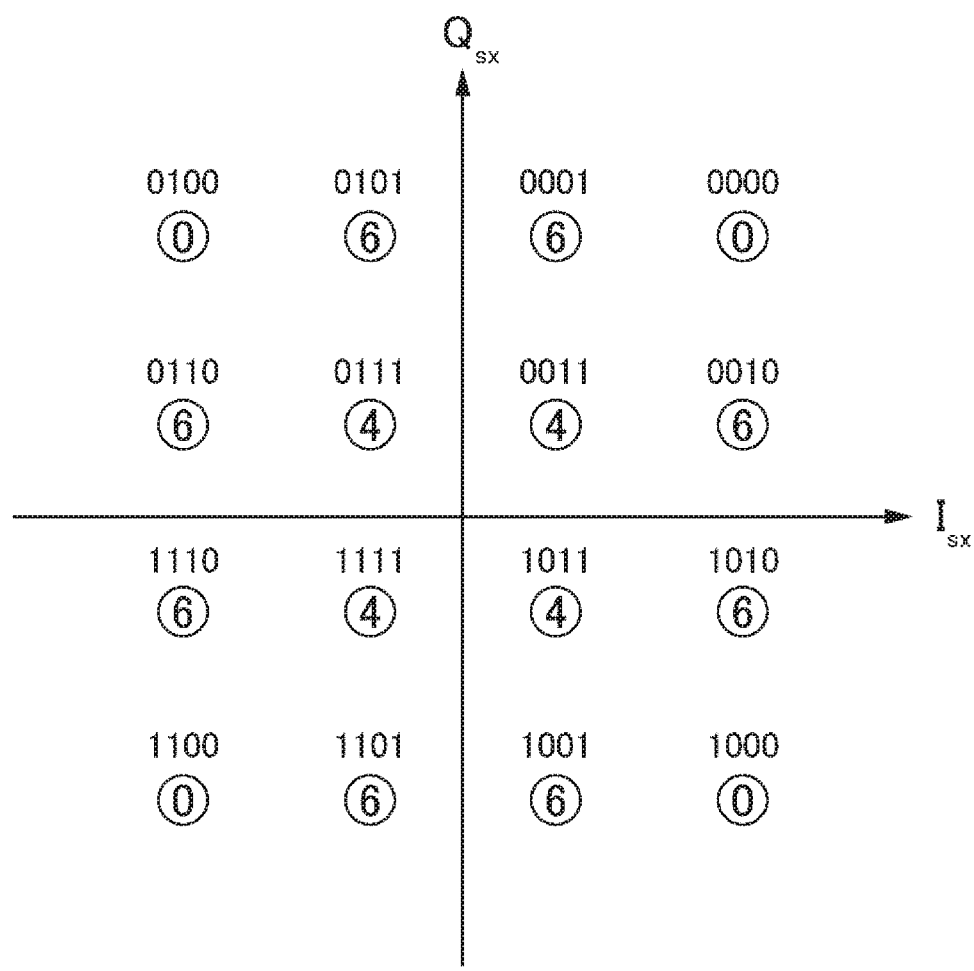
FIG. 8 is a diagram illustrating the appearance frequency of each symbol shown in FIG. 4.

Here, as described above, the prohibition logic is present in the rule of encoding shown in Expression (3). Therefore, the occurrence probability of each symbol shown in FIG. 4 is not uniform. FIG. 8 is a diagram illustrating the appearance frequency of each symbol shown in FIG. 4. Note that the total number of symbols is 2^6. Therefore, it is preferable that weighting according to the occurrence probability of such symbols is performed in the computation of the LLR (Bi). In this manner, it is possible to compute the LLR(Bi) with a higher level of accuracy.

As an example of a method of computing LLR(Bi) considering a difference in the occurrence probability of symbols, an example of the method of computing LLR(B1) will be described. In a case where q2, q1, −q1, −q2 are set in descending order of Qsx coordinates which can be taken by transmission symbols in FIG. 8, the probability of q1 and −q1 being taken is 20/64, and the probability of q2 and −q2 appearing is 12/64. Consequently, in a case where the LLR(B1) is computed in accordance with Expression (2), the expression of the LLR(B1) is represented like the following Expression (15). Here, the numerical values of 20 and 12 are weights given on the basis of the occurrence probability of symbols.

$$LLR(B_1) = \frac{20(q_{rx} - q_1)^2 + 12(q_{rx} - q_2)^2}{20(q_{rx} + q_1)^2 + 12(q_{rx} + q_2)^2} \quad (15)$$

Particularly, in a case where the LLR(B1) is computed using a look-up table, received symbol coordinates are quantized, and thus the expression of the LLR(B1) is represented by the following Expression (16).

$$LLR(B_1) = \frac{20(Q_{rx} - q_1)^2 + 12(Q_{rx} - q_2)^2}{20(Q_{rx} + q_1)^2 + 12(Q_{rx} + q_2)^2} \quad (16)$$

LLR(B1) computed in advance with respect to all the values of Qrx which can be taken is stored in the look-up table. The same is true of B2 to B8.

Note that, in a case where such weighting is not performed (in a case where the second bit sequence is generated using general encoding such as, for example, 16 quadrature amplitude modulation (QAM)), the expression of LLB (i) is represented like the following Expression (17).

$$LLR(B_1) = \frac{(Q_{rx} - q_1)^2 + (Q_{rx} - q_2)^2}{(Q_{rx} + q_1)^2 + (Q_{rx} + q_2)^2} \quad (17)$$

The second computation unit 2060 obtains the LLR(bi) of each bit of the first bit sequence by applying the LLR(Bi) which is output from the first computation unit 2040 to Expression (14). Note that the second computation unit 2060 is implemented as an LSI circuit, and gives each LLR(Bi) to an input of this LSI circuit, whereby each LLR(bi) is output from this LSI circuit. Expression (14) is implemented in this LSI as a combination of logic circuits.

The decoding unit 2080 outputs the transmission bit sequence a by performing decoding on the basis of each LLR(bi) which is output from the second computation unit 2060. Note that the decoding unit 2080 is implemented as an LSI circuit, and gives each LLR(bi) to an input of this LSI circuit, whereby the transmission bit sequence is output from this LSI circuit.

As described above, the optical reception apparatus 2000 computes the log-likelihood ratio LLR(Bi) of the second bit sequence B from the received symbol signal instead of directly computing the log-likelihood ratio LLR(bi) used in soft decision for decoding the transmission bit sequence from the received symbol signal, and computes the LLR(bi) from the LLR(Bi) using the expression of the LLR(bi) capable of being derived on the basis of the rule of encoding. Here, the LLR(Bi) can be computed on the basis of information of a lower dimension than the number of dimensions of the received symbol signal. Therefore, according to the optical reception apparatus 2000, even in a case where the number of dimensions of the received symbol signal is large, the log-likelihood ratio LLR(bi) used in soft decision can be computed with light-weight computation.

In addition, the LLR(Bi) can be computed on the basis of information of a lower dimension than the number of dimensions of the received symbol signal, and thus the look-up table of the LLR(Bi) can be configured with a small size. Thus, according to the optical reception apparatus 2000, it is possible to reduce the size of the look-up table used for speeding up the computation of the log-likelihood ratio LLR(bi) used in soft decision, and to reduce the size of a storage device that stores the look-up table. Thus, even in a case where the number of dimensions of a modulated signal is large, it is possible to reduce the amount of processing of soft decision using a look-up table.

As described above, although the example embodiments of the present invention have been set forth with reference to the accompanying drawings, the embodiments are merely illustrative of the present invention, and various configurations other than those stated above can be adopted.

This application claims priority from Japanese Patent Application No. 2016-088172 filed on Apr. 26, 2016, the content of which is incorporated herein by reference in its entirety.

The invention claimed is:

1. An optical reception apparatus that receives an optical modulated signal transmitted from an optical transmission apparatus,
   wherein the optical transmission apparatus generates a second bit sequence by encoding a first bit sequence, and generates and transmits the optical modulated signal by modulating an optical carrier wave on the basis of a transmission symbol signal generated from the second bit sequence, the first bit sequence being a bit sequence having error correction coding performed on a transmission bit sequence,
   the first bit sequence and the second bit sequence include a plurality of bits, and
   the optical reception apparatus comprising:
   a symbol output unit that acquires the optical modulated signal transmitted by the optical transmission apparatus, and outputs a received symbol signal by demodulating the acquired optical modulated signal;
   a first computation unit that computes a log-likelihood ratio of each bit of the second bit sequence, using the received symbol signal;
   a second computation unit that computes a log-likelihood ratio of each bit of the first bit sequence from the log-likelihood ratio of each bit of the second bit sequence, on the basis of a correspondence relationship between each bit of the second bit sequence and each bit of the first bit sequence; and
   a decoding unit that decodes the transmission bit sequence using the log-likelihood ratio of each bit of the first bit sequence,
   at least one bit included in the second bit sequence is computed using two or more bits included in the first bit sequence.

2. The optical reception apparatus according to claim 1, wherein the first computation unit computes a log-likelihood ratio of the second bit sequence using a look-up table, the second bit sequence corresponding to the received symbol signal output by the symbol output unit, the look-up table storing the log-likelihood ratio of each bit of the second bit sequence in association with the received symbol signal.

3. The optical reception apparatus according to claim 1, wherein the log-likelihood ratio of each bit of the second bit sequence is computed on the basis of information of a lower dimension than the number of dimensions of the received symbol signal.

4. The optical reception apparatus according to claim 3, wherein an occurrence probability of each symbol of the received symbol signal is not uniform, and
the log-likelihood ratio of each bit of the second bit sequence is computed by computation weighted on the basis of the occurrence probability of each symbol of the received symbol signal.

5. The optical reception apparatus according to claim 1, wherein a rule of inverse transformation is determined on the basis of an encoding rule of encoding the first bit sequence into the second bit sequence, the rule of inverse transformation being a rule of computing the first bit sequence from the second bit sequence, and
the second computation unit computes the log-likelihood ratio of each bit of the first bit sequence from the log-likelihood ratio of each bit of the second bit sequence, using a rule of computing the log-likelihood ratio of each bit of the first bit sequence from the log-likelihood ratio of each bit of the second bit sequence, which is determined on the basis of the rule of inverse transformation.

6. The optical reception apparatus according to claim 5, wherein as to a logic expression for computing at least one bit of the first bit sequence in the rule of inverse transformation, the logic expression computing the bit for 0-logic and the logic expression computing the bit for 1-logic are different from each other.

7. The optical reception apparatus according to claim 6, wherein the first bit sequence is a 6-bit bit sequence,
the second bit sequence is an 8-bit bit sequence, and
the rule of encoding is a rule in which:
values of four bits B1, B2, B3, and B4 included in the second bit sequence are set to values of bits different from each other among bits b1, b2, b3, and b4 included in the first bit sequence, and
other four bits B5, B6, B7, and B8 included in the second bit sequence are computed on the basis of the following Expression (1) using x, the x being an exclusive OR among other two bits b5 and b6 included in the first bit sequence and all bits included in the first bit sequence,
wherein, an alignment order of b1 to b6 in the first bit sequence and an alignment order of B1 to B8 in the second bit sequence are arbitrary.

$$B5 = b5 + b6 * \bar{x}$$

$$B6 = \overline{b5} + \overline{b6} * \bar{x}$$

$$B7 = b6 + \overline{b5} * x$$

$$B8 = \overline{b6} + b5 * x \qquad (1)$$

8. The optical reception apparatus according to claim 7, wherein the rule of inverse transformation is a rule of computing the b5 and b6 on the basis of the following Expression (2).

$$b5 = \begin{cases} 0 & \text{in case of } B6(\overline{B5} * B8 + B7 * \overline{B8}) = 1 \\ 1 & \text{in case of } B5(\overline{B7} * B8 + \overline{B6} * B7) = 1 \end{cases} \qquad (2)$$

$$b6 = \begin{cases} 0 & \text{in case of } B8(\overline{B5} * B6 + B5 * \overline{B7}) = 1 \\ 1 & \text{in case of } B7(B6 * \overline{B8} + B5 * \overline{B6}) = 1 \end{cases}$$

9. A system comprising an optical reception apparatus and an optical transmission apparatus according to claim 1,
wherein the optical transmission apparatus includes:
an encoding unit that generates the second bit sequence by encoding the first bit sequence;
a symbol mapping unit that maps the second bit sequence to the transmission symbol signal; and
an optical modulation unit that generates the optical modulated signal by modulating an optical carrier wave on the basis of the transmission symbol signal.

10. A control method which is executed by a computer that receives an optical modulated signal transmitted from an optical transmission apparatus,
wherein the optical transmission apparatus generates a second bit sequence by encoding a first bit sequence, and generates and transmits the optical modulated signal by modulating an optical carrier wave on the basis of a transmission symbol generated from the second bit sequence, the first bit sequence being a bit sequence having error correction coding performed on a transmission bit sequence,
the first bit sequence and the second bit sequence include a plurality of bits, and
the control method comprising:
acquiring the optical modulated signal transmitted by the optical transmission apparatus, and outputting a received symbol signal by demodulating the acquired optical modulated signal;
computing a log-likelihood ratio of each bit of the second bit sequence, using the received symbol signal;
computing a log-likelihood ratio of each bit of the first bit sequence from the log-likelihood ratio of each bit of the second bit sequence, on the basis of a correspondence relationship between each bit of the second bit sequence and each bit of the first bit sequence; and
decoding the transmission bit sequence using the log-likelihood ratio of each bit of the first bit sequence,
at least one bit included in the second bit sequence is computed using two or more bits included in the first bit sequence.

11. The control method according to claim 10,
wherein the method further comprises computing a log-likelihood ratio of the second bit sequence using a look-up table, the second bit sequence corresponding to the received symbol signal output by the symbol output unit, the look-up table storing the log-likelihood ratio of each bit of the second bit sequence in association with the received symbol signal.

12. The control method according to claim 10,
wherein the log-likelihood ratio of each bit of the second bit sequence is computed on the basis of information of a lower dimension than the number of dimensions of the received symbol signal.

13. The control method according to claim 12,
wherein an occurrence probability of each symbol of the received symbol signal is not uniform, and the log-likelihood ratio of each bit of the second bit sequence is computed by computation weighted on the basis of the occurrence probability of each symbol of the received symbol signal.

14. The control method according to claim 10,
wherein a rule of inverse transformation is determined on the basis of an encoding rule of encoding the first bit sequence into the second bit sequence, the rule of inverse transformation being a rule of computing the first bit sequence from the second bit sequence, and
the method further comprises computing the log-likelihood ratio of each bit of the first bit sequence from the log-likelihood ratio of each bit of the second bit sequence, using a rule of computing the log-likelihood ratio of each bit of the first bit sequence from the log-likelihood ratio of each bit of the second bit sequence, which is determined on the basis of the rule of inverse transformation.

15. The control method according to claim 14,
wherein as to a logic expression for computing at least one bit of the first bit sequence in the rule of inverse transformation, the logic expression computing the bit for 0-logic and the logic expression computing the bit for 1-logic are different from each other.

16. The control method according to claim 15,
wherein the first bit sequence is a 6-bit bit sequence,
the second bit sequence is an 8-bit bit sequence, and
the rule of encoding is a rule in which
values of four bits B1, B2, B3, and B4 included in the second bit sequence are set to values of bits different from each other among bits b1, b2, b3, and b4 included in the first bit sequence, and
other four bits B5, B6, B7, and B8 included in the second bit sequence are computed on the basis of the following Expression (3), using x, the x being an exclusive OR among other two bits b5 and b6 included in the first bit sequence and all bits included in the first bit sequence,
wherein, an alignment order of b1 to b6 in the first bit sequence and an alignment order of B1 to B8 in the second bit sequence are arbitrary.

$$B5 = b5 + b6 * \overline{x}$$

$$B6 = \overline{b5} + \overline{b6} * \overline{x}$$

$$B7 = b6 + \overline{b5} * x$$

$$B8 = \overline{b6} + b5 * x \quad (3)$$

17. The control method according to claim 16,
wherein the rule of inverse transformation is a rule of computing the b5 and b6 on the basis of the following Expression (4).

$$b5 = \begin{cases} 0 & \text{in case of } B6(\overline{B5} * B8 + B7 * \overline{B8}) = 1 \\ 1 & \text{in case of } B5(\overline{B7} * B8 + \overline{B6} * B7) = 1 \end{cases} \quad (4)$$

$$b6 = \begin{cases} 0 & \text{in case of } B8(\overline{B5} * B6 + B5 * \overline{B7}) = 1 \\ 1 & \text{in case of } B7(B6 * \overline{B8} + B5 * \overline{B6}) = 1 \end{cases}$$

$$b5 = \begin{cases} 0 & \text{in case of } B6(\overline{B5} * B8 + B7 * \overline{B8}) = 1 \\ 1 & \text{in case of } B5(\overline{B7} * B8 + \overline{B6} * B7) = 1 \end{cases} \quad (4)$$

$$b6 = \begin{cases} 0 & \text{in case of } B8(\overline{B5} * B6 + B5 * \overline{B7}) = 1 \\ 1 & \text{in case of } B7(B6 * \overline{B8} + B5 * \overline{B6}) = 1 \end{cases}$$

* * * * *